(12) United States Patent
Steffan et al.

(10) Patent No.: US 11,293,969 B2
(45) Date of Patent: Apr. 5, 2022

(54) SYSTEM AND METHOD FOR AUTOMATIC TEST-SETUP HARDWARE DETECTION AND EXTENSION

(71) Applicant: Rohde & Schwarz GmbH & Co. KG, Munich (DE)

(72) Inventors: Byron-Lim Timothy Steffan, Munich (DE); Peter Wolanin, Kranzberg/Thalhausen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 517 days.

(21) Appl. No.: 16/351,095

(22) Filed: Mar. 12, 2019

(65) Prior Publication Data

US 2020/0292613 A1 Sep. 17, 2020

(51) Int. Cl.
*G01R 31/28* (2006.01)
(52) U.S. Cl.
CPC .................. *G01R 31/2834* (2013.01)
(58) Field of Classification Search
CPC .......... G01R 31/2834; G01R 31/31908; G01R 31/31907
See application file for complete search history.

(56) References Cited

U.S. PATENT DOCUMENTS

| | | | | |
|---|---|---|---|---|
| 6,557,128 B1 * | 4/2003 | Turnquist | ......... | G01R 31/31713 714/724 |
| 2004/0181763 A1 * | 9/2004 | Soltis, Jr. | ........ | G01R 31/318307 716/111 |
| 2009/0055803 A1 * | 2/2009 | Kondo | ............. | G01R 31/31705 717/126 |
| 2011/0239214 A1 * | 9/2011 | Frields | ................ | G06F 11/3672 718/1 |
| 2014/0189430 A1 * | 7/2014 | Hilliges | .............. | G06F 9/45533 714/27 |
| 2015/0066417 A1 * | 3/2015 | Kimura | ............... | G06F 11/2294 702/123 |

FOREIGN PATENT DOCUMENTS

EP    2153581 B1    2/2010

* cited by examiner

*Primary Examiner* — Manuel A Rivera Vargas
*Assistant Examiner* — Yaritza H Perez Bermudez
(74) *Attorney, Agent, or Firm* — Ditthavong, Steiner & Mlotkowski (57) ABSTRACT

This application is related to a measuring system and method for performing various measurement tasks. The measuring system comprises a test-setup configured to measure the characteristics of a device-under-test and an input-device of the test-setup configured to receive a test-case. The measuring system further comprises several measurement-hardware devices configured to perform the measurements according to the test-case. A computer unit of the measuring system is configured to determine at least one required hardware device on the basis of the test-case and to select the additional measurement-hardware devices. The computer unit is further configured to identify an adding of the selected additional measurement-hardware.

8 Claims, 5 Drawing Sheets

SYSTEM AND METHOD FOR AUTOMATIC TEST-SETUP HARDWARE DETECTION AND EXTENSION

TECHNICAL FIELD

The invention is related to an automatic test-setup hardware detection and extension proposal, in particular a test equipment for performing tests on electronic devices capable of suggesting needed measuring resources.

BACKGROUND ART

Test-systems are used in the production process as well as in the research and development. Such test-systems qualitatively and quantitatively analyze an electrical behavior and a communications behavior of an electronic device. There is a plurality of parameters to be tested. For every test scenario is a specific measurement-hardware setup used.

Nowadays, test-systems are a combination of various measurement equipment. The user selects the measurement gear for each test task. The measurement gear is user selected from the available measurement devices of the users laboratory. If such a needed measurement device is not available in the laboratory, a new measurement device is ordered by the user. The user selects a suitable measurement in a catalogue of his revered vendor or of a contracting vendor.

In the EP 2 153 581 B1 a remote testing system is disclosed. A method and system of supporting and testing equipment distant from the support system are provided. The method is about forming a communications link between the equipment and the support system and using a support system to measure performance of the equipment and to provide a set of performance data. The support system provides library data relating to the equipment and compares the performance data with the library data. Furthermore, the compared data is analyzed whereby a performance diagnosis of the equipment is provided.

What is needed is a test-setup whereby the necessary measurement equipment is adapted to a measurement problem in a more efficient way by an optimal usage of the resources.

SUMMERY OF THE INVENTION

Example embodiments of the present invention advantageously address the foregoing requirements and needs, as well as others, by providing equipment and associated methods that facilitates the measurement equipment adaptation to a measurement problem in a more efficient way by an optimal usage of the resources.

In accordance with a first aspect of the invention, a measuring system is provided for performing various measurement tasks. The measuring system comprises a test-setup configured to measure the characteristics of a device-under-test and an input-device of the test-setup configured to receive a test-case. The measuring system further comprises at least one measurement-hardware device configured to perform the measurements according to the test-case. A computer unit of the measuring system is configured to determine at least one required hardware device on the basis of the test-case and to select the additional measurement-hardware devices. The computer unit is further configured to identify an adding of the selected additional measurement hardware.

In accordance with one preferred embodiment, the measuring system with its computer unit determines the availability of the selected measurement-hardware in a measurement-hardware pool. By way of example, the measurement-hardware pool comprises the company owned measurement-hardware distributed over a plurality of locations. The availability also depends on the status concerning the usage of the measurement-hardware.

According to a further preferred embodiment, the computer unit determines the availability of the selected measurement-hardware devices by combining at least two of the measurement-hardware devices listed in the measurement-hardware pool. By way of example, a test-case is a measurement of a scalar transfer function of a device-under-test. Usually, a scalar network analyzer is used for this measurement task. If there is no scalar network analyzer available, this task can be solved by a combination of a signal source with a power detector.

According to a further preferred embodiment, a procurement of non-pool measurement-hardware is initiated by the computer unit in case of a lack of measurement-hardware in the pool, wherein a procured non-pool measurement-hardware is added to the measurement-hardware pool. By way of example, if the computer unit identifies a missing measurement-hardware a vendor is contacted automatically by the computer unit for procurement of additional hardware.

According to a further embodiment, the computer unit determines the availability a second test-setup meeting the required measurement-hardware and suggesting the application of the second test-setup meeting the required measurement-hardware. By way of example, the computer unit notes that the test-setup needs additional measurement-hardware it has the capability to check if there is a suitable second test-setup completely meeting the test-case. Therefore, a necessary adaption of the measurement-hardware can be avoided or be kept to minor adaptations.

In accordance to a further preferred embodiment, the computer unit for determining a required measurement-hardware is integrated in the test-setup.

According to a second aspect of the invention, a method for a hardware adaptation in a test-setup is provided.

This method comprises receiving a test-case for the test-setup by an input-device of the test-setup and determining a required measurement-hardware on basis of the test-case by a computer unit. The method further comprises comparing the required measurement-hardware devices with measurement-hardware devices of the test-setup, selecting additional measurement-hardware and identifying an adding of the selected additional measurement-hardware.

The method according to a preferred embodiment comprises a determination of the availability of the selected measurement-hardware in a measurement-hardware pool by the computer unit.

In one preferred embodiment, a further method step is determining the availability of the selected measurement-hardware devices by combining at least two of the measurement-hardware devices listed in the measurement-hardware pool by the computer unit.

According to a further preferred embodiment, the method comprises initiating a procurement of non-pool measurement-hardware in case of a lack of measurement-hardware in the pool, and adding a procured non-pool measurement-hardware to the measurement-hardware pool.

In one preferred embodiment a further method steps are determining the availability a test-setup meeting the required measurement-hardware and suggesting the application of test-setup meeting the required measurement-hardware by the computer unit.

According to a further preferred embodiment, the computer unit for determining a required measurement-hardware is integrated in the test-setup.

BRIEF DESCRIPTION OF THE DRAWINGS

An exemplary embodiment of the invention is now further explained by way of example only with respect to the drawing which

DETAILED DESCRIPTION OF PREFERRED EMBODIMENTS

Equipment and associated methods for an automatic test-setup hardware detection and making an extension proposal for performing measurements in a more efficient way without wasting time test-setup preparation are described hereafter. In the following description, for purpose of explanation, numerous specific details are set forth in order to provide a thorough understanding of the present invention. The present invention is not intended to be limited based on the described embodiments, and various modifications will be readily apparent. It will be apparent that the invention may be practiced without specific details of the following description and/or with equivalent arrangements. Well-known structures and devices may be shown in block diagram form in order to avoid unnecessarily obscuring of the invention. Further, the specific applications discussed herein are provided only as representative examples, and the principles described herein may be applied to other embodiments and applications without departing from the general scope of the present invention.

Figure 1:
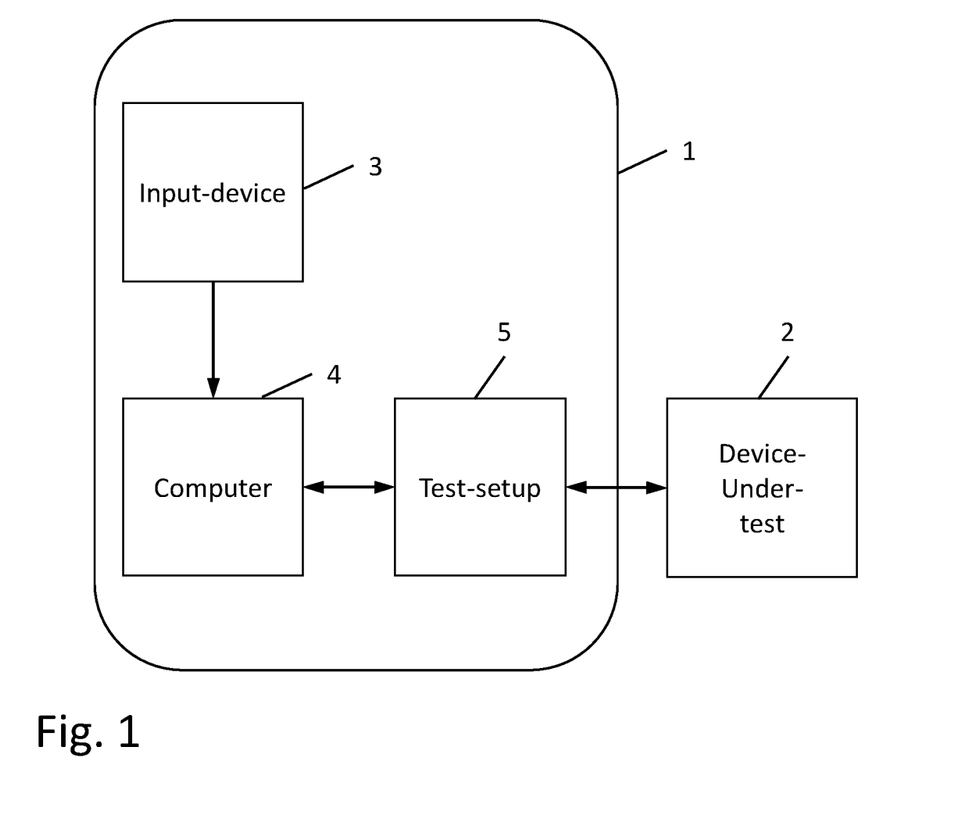
FIG. 1 shows an embodiment the test-system.

FIG. 1 shows the block diagram of a test-system 1 according to example embodiments of this invention. The test-system 1 is connected to a device-under-test (DUT) 2. By way of example, the device-under-test 2 is supplied with power from to test-system 1. Furthermore, the device-under-test 2 receives stimulus signals from the test-system 1. The signals produced by the device-under-test 2 are received by the test-system 1. The test-system 1 is further capable of performing communication protocols for testing the performance of the device-under-test 2. The exemplary test-system 1 comprises a test-setup 3, a computer unit 4 and an input-device 3. The computer unit 4 is used to provide the test scenarios received by the input-device 3 to the test-setup 5.

The input-device 3 receives commands and parameters concerning a test-case executed by the computer unit 4 and the test-setup 5. By way of example, the input-device 3 is a card reader receiving a flash based memory card. There is a plurality of flash memory available. Some example of types are CompactFlash (CF), Memory Stick (MS), Multimedia Card (MMC), Secure Digital Memory Card (SD), Smart Media (SM), USB-Stick etc. The listed flash memories are a no exhaustive enumeration. Other memory technologies like magnetic storage devices are not excluded. The input-device 3 receives the stored test-case information and sends the received information to the computer unit 4. By way of further example, the input-device 3 is a connection to a communications bus like Ethernet, GPIB, IEEE488, RS232, USB, VXI, LXI etc. There is a wide variety of buses for measurement applications available and conceivable. Therefore, further communication technologies are not excluded. A further example for an input-device 3 may be a keyboard or a pointing device.

The computer unit 4 is responsible for steering the measurements. Therefore, the computer unit 4 processes the test-cases received from the input-device 3. At first, the computer unit checks the test-setup if there is the required measurement-hardware for the test-case on board. If the required measurement-hardware is missing, the computer unit 4 selects additional measurement-hardware. The computer unit 4 identifies the adding of additional measurement-hardware so that the test-setup is enabled to perform the measurements according to the test-case. With the identification of the additional measurement-hardware an automated installation of such an additional measurement-hardware is initiated. The installation of the additional measurement-hardware can be installed in a fully automated process by robots. After completion of the test-setup 5 the information within the test-cases are used to control the test-setup 5.

Figure 2:
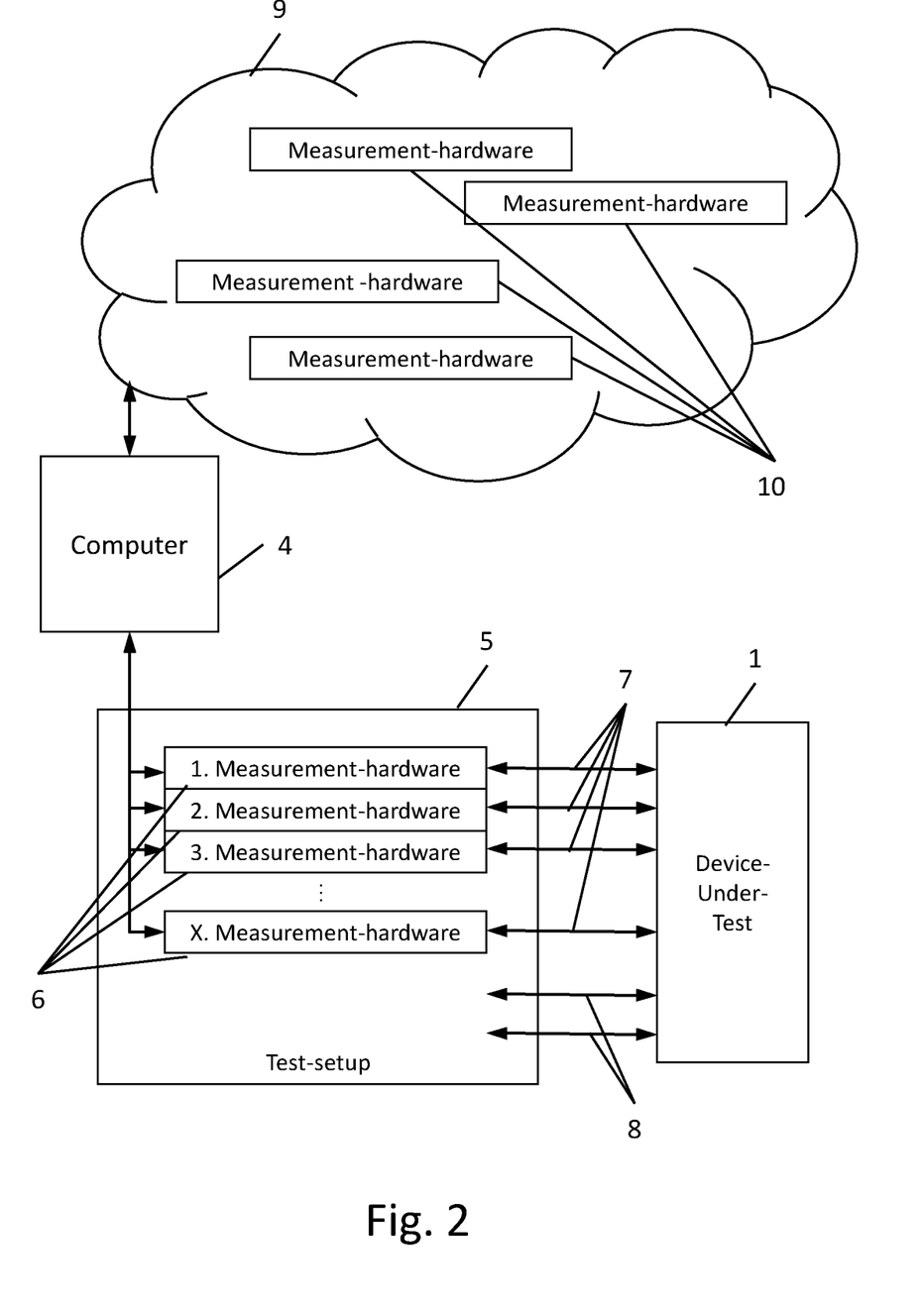
FIG. 2 shows an embodiment the test-setup of the test-system with measurement-hardware and a pool of measurement-hardware.

FIG. 2 shows in more detail the test-setup 5 of the test-system 1 with measurement-hardware 6 according to example embodiments of this invention. The computer unit 4 is connected to the test-setup 5 in a way that the computer unit 4 is capable to collect all necessary information of the presence of the measurement-hardware 6 within the test-setup 5. This interconnection is done by any of the above-mentioned bus. The measurement-hardware 6 being present in the test-setup 5 is checked for the test considerations according to the test-case obtained via the input-device 3. These test-cases concerning each of a single measurement-hardware 6 are indicated by the arrows 7 and 8. As it can be seen, the test-cases 8 are not provided with a measurement-hardware. The computer unit 4 determines that at least one additional measurement-hardware device is required.

By way of example, if the computer unit 4 comes to the result of missing measurement-hardware, the computer unit 4 will check a measurement-hardware pool 9 comprising further measurement-hardware 10 and selects the suitable device of the measurement-hardware 10. This measurement-hardware pool 9 comprises all measurement-hardware 10 listed for the company. The listed measurement-hardware 10 can be distributed in different locations within the company. In more detail, the measurement-hardware 10 listed for the pool can belong do different locations at the company site independent to the department of the company. Furthermore, the pool 9 comprises measurement-hardware 10 of all further company locations. Therefore, in case of costly measurement gear it is highly advantageous to involve all the company owned measurement-hardware 10 in a common pool 9.

There is a wide variety of measurement-hardware applicable. A measurement-hardware can be a power-source in particular a DC voltage source, an AC voltage source, a DC current source and/or a four-quadrant power source. Devices for measuring the basic electrical parameters can for example be a voltmeter, an amperemeter and/or a power meter. A measurement-hardware for signal measurement can for example be an oscilloscope, a spectrum analyzer, a measurement receiver, an EMC receiver and/or a network analyzer. A stimulation of the device-under-test 1 can be done by an audio frequency generator, a radio frequency generator, an arbitrary generator and or any digital signal source.

A further kind of measurement-hardware is the wide field of network emulators for emulating 5G networks, LTE networks, CDMA networks etc. Beside the network emulators the measurement-hardware can be protocol testers for Ethernet, CAN bus, Interbus S, 5G networks, LTE networks, CDMA networks etc. Also environmental measurement-hardware such as temperature sensors, forward looking infrared sensors, humidity sensors are applicable. All these devices can have the capability of data-logging. However, this is not to be regarded as an exclusive list of measurement-hardware.

Figure 3:
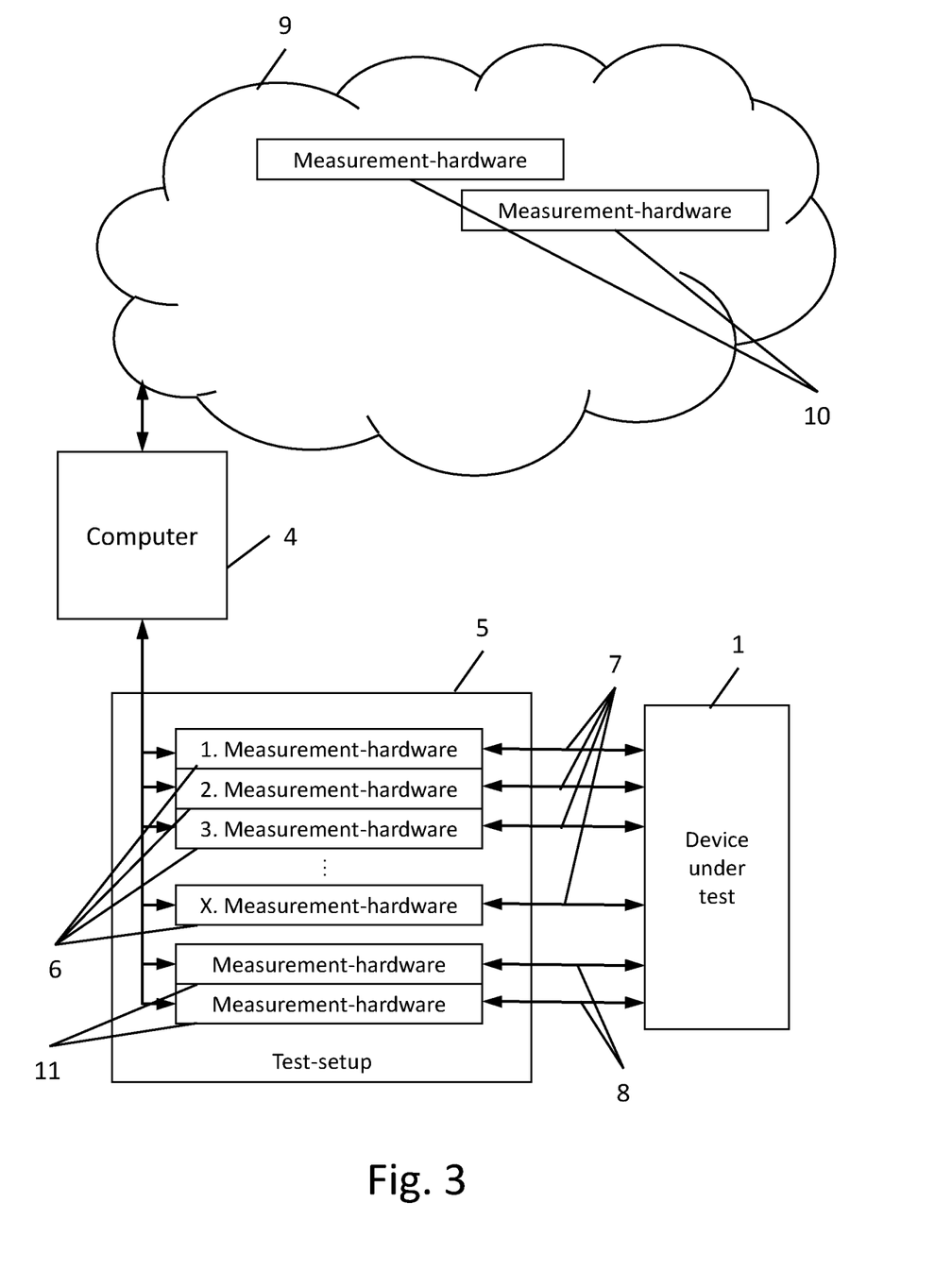
FIG. 3 shows an embodiment the test-setup with measurement-hardware and with integrated measurement-hardware from the pool of measurement-hardware.

FIG. 3 depicts the test-setup 5 with its included measurement-hardware 6 and 11 and the pool 9 of measurement-hardware 10. This is the configuration after identification of adding the selected measurement-hardware 10 into the test-setup 5 by the computer unit 4. By way of example, two of the measurement-hardware 10 devices have been selected and are now integrated into the test-setup 5. The test-cases 8 are now provided with additional measurement-hardware 11.

According to example embodiments, an additional measurement-hardware 11 device may be a combination of at least one measurement-hardware devices. As an example, is a power sensor is not a part of the pool 9. This power-sensor can be replaced by an amperemeter in combination with a voltage-meter.

According to example embodiments, there is no suitable additional measurement-hardware 11 device even in a combination of at least one measurement-hardware device available in the measurement-hardware pool 9. In this case, the computer unit 4 is capable of initiating a procurement of the missing measurement-hardware. The procurement can be assisted by a vendor of measurement gear or by authorized distributors. When the additional measurement-hardware is available, the computer unit 4 initiates the addition of the measurement-hardware to the pool of measurement-hardware.

In an example embodiment, the computer unit determines the availability of a second test-setup meeting the required measurement-hardware. If a better suitable test-setup is detect, the alternative test-setup is used. This has the particular advantage of using a complete configured test-setup by minimizing the reconfiguration efforts.

Figure 4:
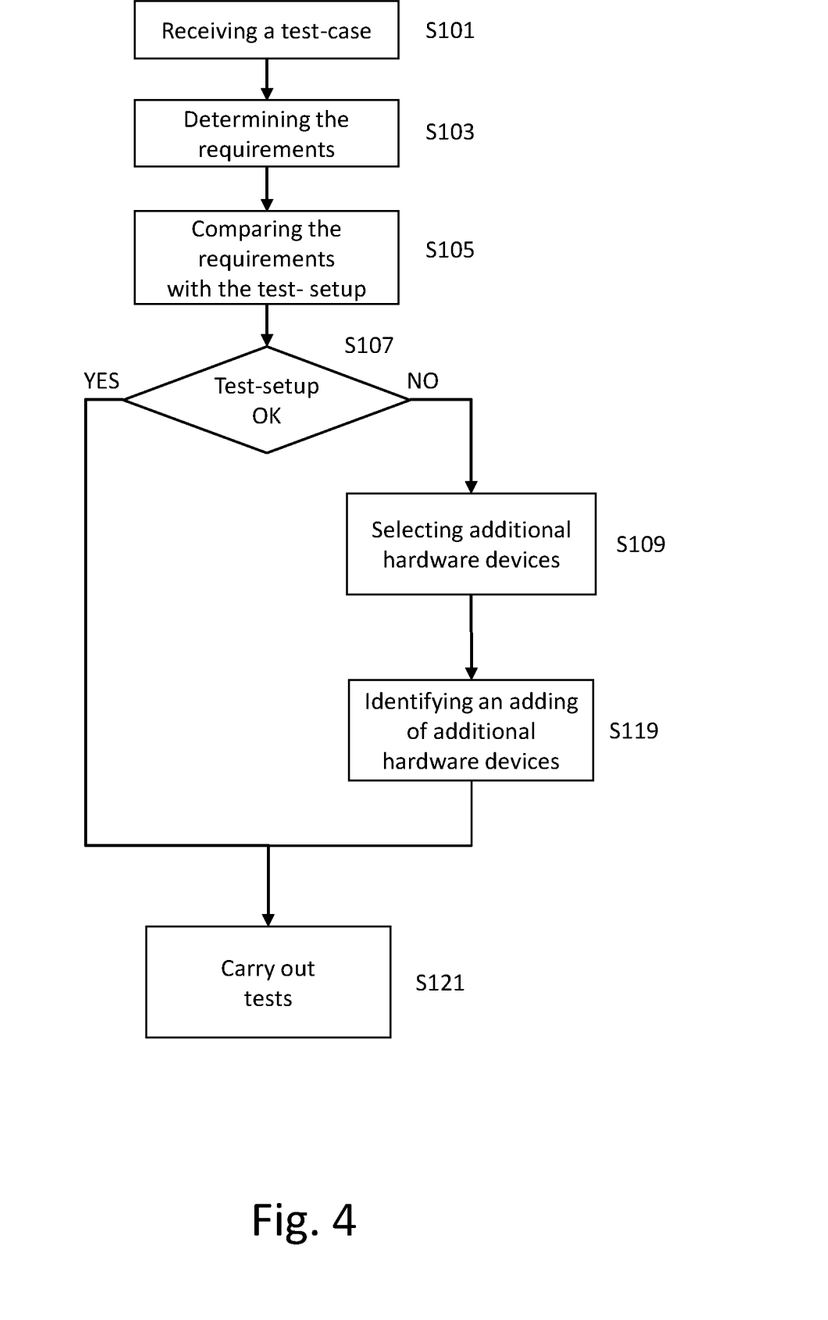
FIG. 4 shows a flowchart of an embodiment of the configuration process of a measurement system.

FIG. 4 shows the basic method of automatic test-setup hardware detection and extension proposal. In a first step S101, the computer unit 4 of the test-system 1 receives a test-case via the input-device 3 of the test-setup 1. By way of example, the test-case includes all information about the processes and parameters necessary for preforming a test of a device-under-test 2. This information includes for example power settings for supplying the device-under-test. In case of a communications device, the settings according to a physical communications layer are included. This physical layer might also comprise modulation settings and frequency settings.

Additionally, the test-case includes information concerning a communications protocol. Beside this, the test-case may include information for simulating fading of transmission channels. A further exemplary aspect of the test-case is the information for steering the test-setup concerning the signal analysis. The test-case includes information for steering the signal analysis and may be done for radio frequency parameters, e.g. RF-power, frequency, modulation. Further signal analysis steered on basis of the test-case may be audio signal analysis, digital signal analysis, logic analysis etc. Last but not least, in-circuit-debugging scenarios may be included in the test-case. This is a non-exhaustive listing of possible information included in the test-case.

With the information included in the test-case, the computer unit 4 determines the requirement of measurement-hardware in step S103. The test-case is analyzed by the computer unit 4. The measurement tasks are linked a certain measurement-hardware. By way of example, the measurement of a distribution transmit power of a device-under-test being e.g. a mobile phone, is linked to a real time spectrum analyzer. Some measurement tasks can also be tested with a high complex measurement-hardware. Using high complex measurement-hardware leads to a reduction of the amount of required measurement-hardware as a wide variety of measurement tasks can be executed by a single device. By way of example, a high complex measurement-hardware may be a radio communications tester. Radio communications tester combines RF signal analysis capabilities with protocol test capabilities.

In step S105, the computer unit 4 compares the determined requirements of the test-case with the determined measurement-hardware requirements of step S103.

In step 107, the computer unit 4 selects the continuation path of the process. When the test-setup 5 fails the requirements of the process, the process is branched to further method steps. If the test-setup 5 fulfills the requirements of the test-case, the process is branched to the execution of the testing according to step S121.

In the case that the measurement-hardware requirements are not met by the test-setup 5, additional measurement-hardware is selected by the computer unit 4 in step S109. The information of the hardware suitable for the requirements may be stored in a database comprising the information of measurement-hardware and the measurement capabilities of the certain hardware.

In step 119, the computer unit 4 identifies an adding of additional hardware. With this step, the test-setup 5 is completed with additional measurement-hardware. This adaptation may be done by using an automated assembly line. A manual installation of measurement-hardware is not excluded for this method step.

When the test-setup 5 is fully featured according to the test-case, the test for the device-under-test are executed in step 121.

Figure 5:
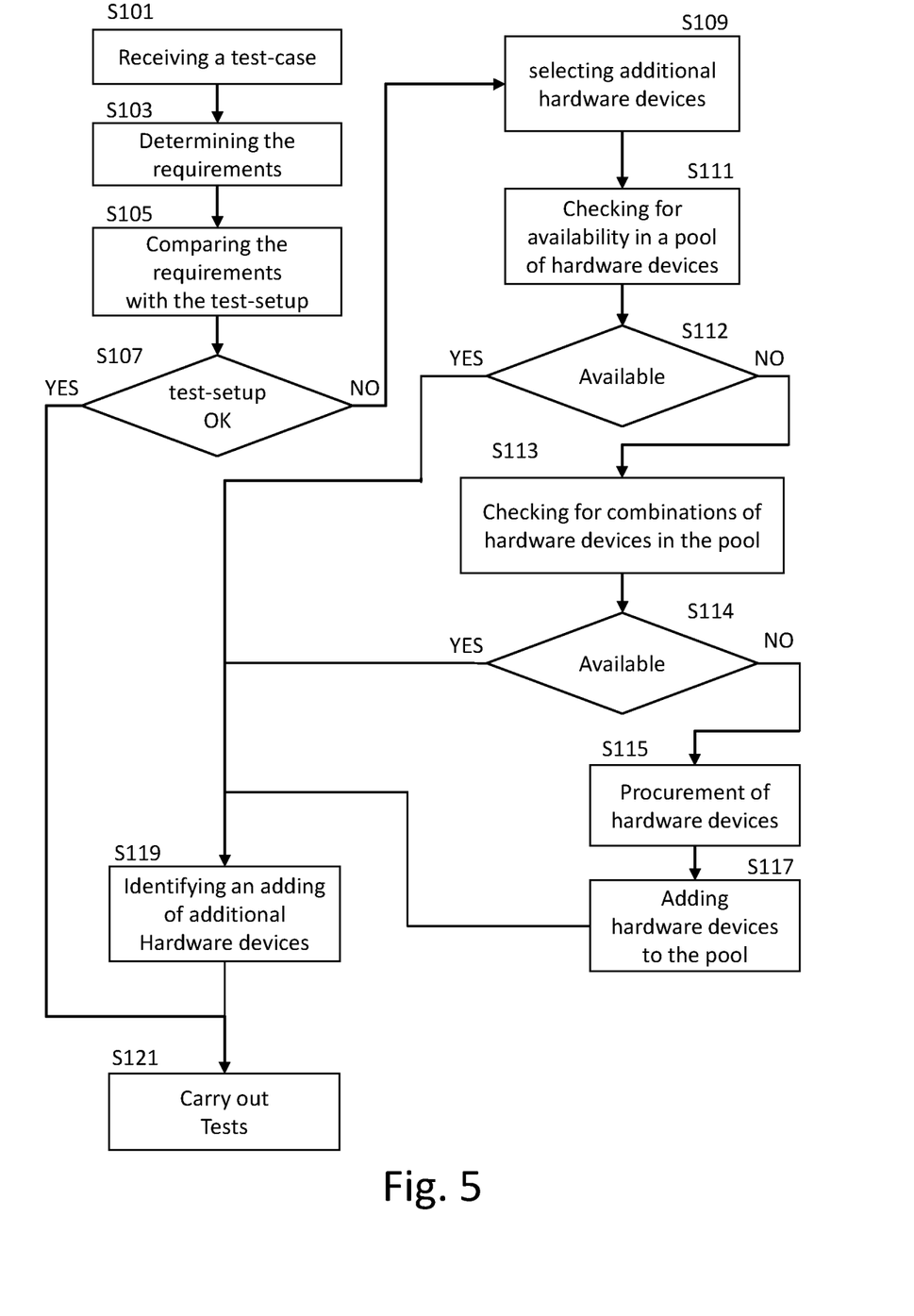
FIG. 5 shows a further flow chart of an embodiment of the process for configuration of the measurement system.

FIG. 5 shows a further embodiment of the process for configuration of the measurement system 1. The basic concept has been described on basis of FIG. 4. For sake of clarity the above-described process steps are shortly mentioned.

In a first step S101, the computer unit 4 of the test-system 1 receives via the input-device 3 of the test-setup 1 a test-case. In the following step S103, the computer unit 4 determines the requirement of measurement-hardware.

The computer unit 4 compares in step 105 the determined requirements of the test-case with the determined measurement-hardware requirements.

In step 107, the computer unit 4 selects the continuation path of the process.

When the measurement-hardware requirements are not met by the test-setup 5, additional measurement-hardware is selected by the computer unit 4 in step S109.

In step S111, the computer unit 4 checks the availability of additional measurement-hardware 10 in a pool 9 of measurement-hardware devices. By way of example, the computer unit 4 is capable to read a database describing the available measurement-hardware. The database includes the technical specifications of the certain measurement-hardware. Furthermore, the time information of availability is included. Solely a list of present hardware devices is not sufficient. Further information should be included in the database. The further information comprises date of reservation for further projects, maintenance information, validity of calibration and declarations of damages. On the basis of this information, a reliable verification can be done by the computer unit 4.

The pool 9 of measurement-hardware is not limited to a certain laboratory. The required measurement-hardware 10 may be located in a pool 9 of measurement-hardware spread within the company. It should be mentioned that companies with distributed company sites might be enabled to include all the measurement-hardware devices 10 to a common pool 9 of hardware devices.

In step S112, the computer unit decides, whether all requirements are fulfilled. When the requirements are met, the computer unit continues with identifying an adding of additional measurement-hardware devices step S119.

Step S113 is executed when the result of the availability check of the measurement-hardware in step S112 fails. In step 113, the computer unit 4 seeks for a combination of the available measurement-hardware 10 in the abovementioned pool 9 of measurement-hardware capable of proper replacing a single measurement-hardware device. This step S113 leads to a fast and cost saving application of a suitable test-setup 5.

In step S114, the computer unit decides if the combined measurement-hardware now fulfills the requirements. If this is true, the computer unit continues with identifying an adding of additional measurement-hardware devices step S119.

When the pool 9 of measurement-hardware 10 fails to provide any suitable measurement-hardware component device step S115 is executed. In step S115, the computer unit 4 initiates a procurement of additional measurement-hardware devices. By way of example, the computer unit 4 exactly identifies the requirements of the additional measurement-hardware. The resulting specifications are used to select a certain measurement-hardware device within a catalog of measurement-hardware devices. When a device is selected out of the catalog, the computer unit 4 starts the procurement. The procurement can be done in combination with an external vendor. In this case, the computer unit 4 sends the necessary information to the vendor. The vendor executes the request and automatically provides the concerned measurement-hardware to the test-system 1.

With the successful procurement, the procured measurement-hardware device is added to the pool 9 of measurement-hardware in step S117. Bay way of example, the procured measurement-hardware in now made accessible by using the pool 9 of measurement-hardware.

The computer unit 4 identifies an adding of additional hardware in step 119 and the computer unit 4. With this step, the test-setup 5 is completed with additional measurement-hardware.

When the test-setup 5 is fully featured according to the test-case, the test for the device-under-test are executed in step 121.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalences. Although, the invention has been illustrated and described with respect to one or more implementations, equivalent alterations and modifications will occur to others skilled in the art upon the reading and understanding of this specification and the enacts drawings. In addition, while a particular figure of the invention may have been disclosed with respect to only one of several implementations, such features may be combined with one or more other features of the other implementations as may be desired and advantageous for any given or particular application.

What is claimed is:

1. A measuring system comprising:
   a test-setup configured to measure the characteristics of a device-under-test,
   an input-device of the test-setup configured to receive a test-case,
   several one measurement-hardware devices configured to perform the measurements according to the test-case, and
   a computer unit configured to determine at least one required measurement-hardware device on the basis of the test-case and to select any additional measurement-hardware devices,
   wherein the computer unit determines the availability of the selected measurement-hardware devices in a measurement-hardware pool,
   wherein the computer unit is configured to identify an adding of the selected additional measurement-hardware devices,
   wherein a procurement of non-pool measurement-hardware is initiated by the computer unit in case of a lack of measurement-hardware in the pool, and
   wherein a procured non-pool measurement-hardware device is added to the measurement-hardware pool.

2. The measuring system according to claim 1, wherein the computer unit determines the availability of the selected measurement-hardware devices by combining at least two of the measurement-hardware devices listed in the measurement-hardware pool.

3. The measuring system according to claim 1, wherein the computer unit determines the availability of a second test-setup meeting the required measurement-hardware and suggests the application of the second test-setup meeting the required measurement-hardware.

4. The measuring system according to claim 1, wherein the computer unit for determining a required measurement-hardware is integrated in the test-setup.

5. A method for a hardware adaptation in a test-setup comprising:
   receiving a test-case for the test-setup by an input-device of the test-setup;
   determining required measurement-hardware devices on basis of the test-case by a computer unit;
   comparing the required measurement-hardware devices with measurement-hardware devices of the test-setup;
   initiating a procurement of non-pool measurement-hardware devices in case of a lack of measurement-hardware devices in a pool;

adding any procured non-pool measurement-hardware device to a measurement-hardware pool;

selecting any additional measurement-hardware devices;

determining the availability of the selected measurement-hardware device in a measurement-hardware pool by the computer unit; and identifying an adding of the selected additional measurement-hardware.

6. The method according to claim 5, further comprising:

determining the availability of the selected measurement-hardware devices by combining at least two of the measurement-hardware devices listed in the measurement-hardware pool by the computer unit.

7. The method according to claim 5, further comprising:

determining the availability a of test-setup meeting the required measurement-hardware by the computer unit and suggesting the application of a test-setup meeting the required measurement-hardware devices by the computer unit.

8. The method according to claim 5, wherein the computer unit for determining a required measurement-hardware is integrated in the test-setup.

\* \* \* \* \*